US006490168B1

(12) United States Patent
Rochowicz et al.

(10) Patent No.: US 6,490,168 B1
(45) Date of Patent: Dec. 3, 2002

(54) INTERCONNECTION OF CIRCUIT SUBSTRATES ON DIFFERENT PLANES IN ELECTRONIC MODULE

(75) Inventors: William Rochowicz, Park Ridge, IL (US); Declan Killarney, Wadsworth, IL (US); Tom Gall, Northbrook, IL (US); Chris Van Houten, Chicago, IL (US); Don Zito, Fox River Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/406,467

(22) Filed: Sep. 27, 1999

(51) Int. Cl.[7] .............................. H05K 1/11; H05K 1/14
(52) U.S. Cl. ...................... 361/784; 361/803; 361/790; 361/735; 361/376; 361/742; 361/740; 361/758; 361/785; 361/799; 174/138 G
(58) Field of Search ................................ 361/742, 758, 361/790, 791, 799, 784, 796, 803, 759, 801, 807, 809; 439/61, 74–75, 82–83, 76.1; 174/267, 138 G, 138 D, 138 E

(56) References Cited

U.S. PATENT DOCUMENTS 4,929,185 A * 5/1990 Wong et al. .................. 439/74
5,348,482 A * 9/1994 Rudy, Jr. et al. .............. 439/61
5,608,611 A * 3/1997 Szudarek et al. ....... 174/138 G
5,825,633 A * 10/1998 Bujalski et al. ......... 174/138 G

* cited by examiner

Primary Examiner—David Martin
Assistant Examiner—Thanh Y. Tran
(74) Attorney, Agent, or Firm—Gary J. Cunningham; Steven A. May; Thomas V. Miller

(57) ABSTRACT

An electronic module (20) includes a first circuit substrate (40) and a second circuit substrate (44). The first circuit substrate (40) has a post surface (50) and a post (52) protruding from the post surface (50). The second circuit substrate (44) has an upper surface (46) opposed to a lower surface (48). The second circuit substrate (44) forms an opening (56). The first circuit substrate (40) may be manufactured using a Molded Interconnect Device substrate. The second circuit substrate (44) may be manufactured using a High Density Interconnect substrate. The second circuit substrate (44) is placed on top of the first circuit substrate (40) so that the post (52) of the first circuit substrate (40) is mated with the opening (56) of the second circuit substrate (44). During a solder screening process a solder paste is applied to the opening (56) of the second circuit substrate (44), and during a solder reflow operation the solder paste melts and a connection is formed between the first circuit substrate (40) and the second circuit substrate (44).

20 Claims, 4 Drawing Sheets

INTERCONNECTION OF CIRCUIT SUBSTRATES ON DIFFERENT PLANES IN ELECTRONIC MODULE

FIELD OF THE INVENTION

This invention relates, in general, to an electronic module containing multiple circuit substrates, and more particularly, to an electronic module comprising a first circuit substrate having a post and a second circuit substrate forming an opening.

BACKGROUND OF THE INVENTION

Electronic modules used in automotive applications often employ electronic components mounted to a printed circuit substrate. The electronic components are typically soldered to the circuit substrate and electrically coupled to metal traces overlying the surface of the circuit substrate. Typically, for automotive control applications, the electronic components are mounted on two or more circuit substrates. In order for the electronic components mounted on different circuit substrates to communicate with one another, the circuit substrates must be electronically connected. Typically the circuit substrates are connected using separate cables which connect to pins mounted onto the circuit substrates. However, the cables are expensive and the pins, as well as being expensive, are not robust in an automotive environment. To reduce product cost, it would be desirable to eliminate the cables and pins and replace them with an alternative connection method.

In addition to having an expensive connection method, electronic modules used in automotive applications tend to be bulky. This is due to the fact that electronic modules typically use either polyamide or FR4 circuit substrate in combination with separate cables which connect to pins. Since polyamide and FR4 circuit substrates are flexible, the electronic modules must be housed in a housing comprising rigidizers. Rigidizers are components used to increase the rigidity of the polyamide or FR4 circuit substrate. The use of rigidizers along with separate cables and pins increases the size and cost of electronic modules. Accordingly, further development of circuit substrates and connection methods is necessary to reduce the size and cost of electronic modules.

Figure 1:
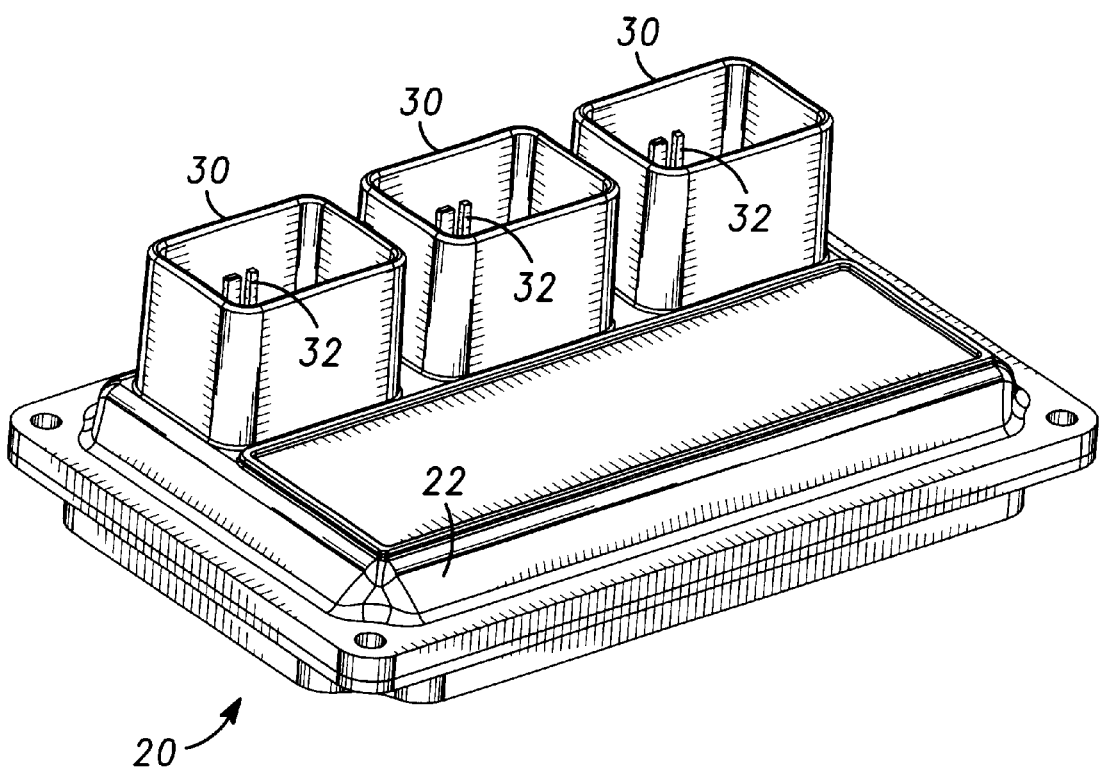
FIG. 1 is a a perspective view of the housing of an electronic module according to one embodiment of this invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF THE INVENTION

The present inventions is for an electronic module in which a first circuit substrate is manufactured using a Molded Interconnect Device substrate and is connected to a second circuit substrate. The first circuit substrate is made with protrusions or posts built in, while the second circuit substrate is made with holes or openings. When the second circuit substrate is placed on top of the first circuit substrate, the posts of the first circuit substrate are mated with the openings of the second circuit substrate. During a solder screening process, a solder paste is applied to the openings of the second circuit substrate. When the first circuit substrate and the second circuit substrate pass through a solder reflow operation, the solder paste melts and a connection is formed between the first circuit substrate and the second circuit substrate. By using a Molded Interconnect Device substrate, the electronic module of the invention eliminates the need for expensive cables or pins. The second circuit substrate can be manufactured using FR4, polyamide, or any other type of circuit substrate. In one preferred embodiment of this invention, the second circuit substrate is manufactured using a High Density Interconnect substrate. By using a High Density Interconnect substrate in combination with an Molded Interconnect Device substrate, the size of the electronic module can be significantly reduced.

Figure 7:
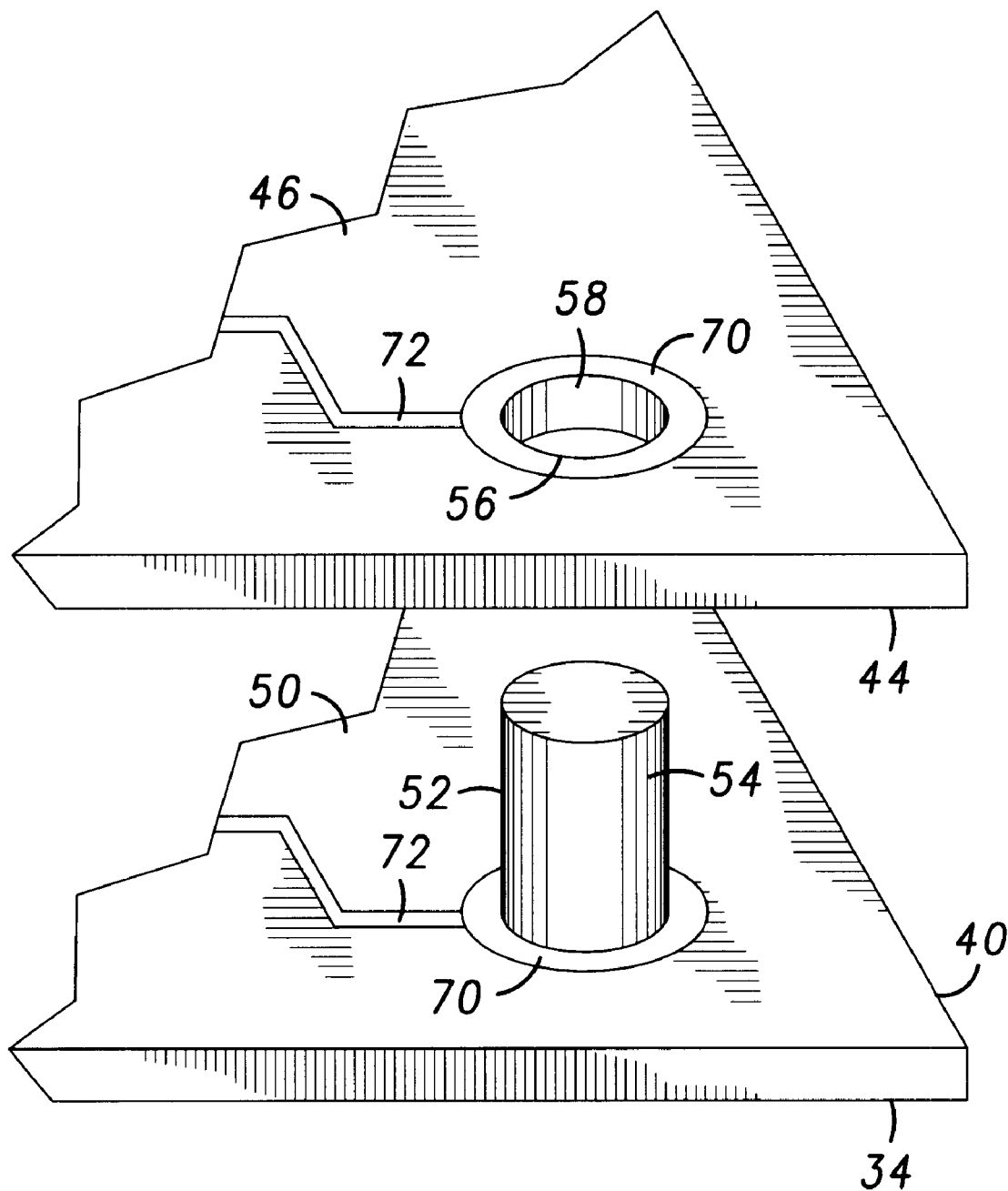
FIG. 7 is an exploded view of the of the first circuit substrate and the second circuit substrate of the electronic module, according to one embodiment of this invention.

FIG. 1 shows a perspective view of electronic module 20, according to one preferred embodiment of this invention. Electronic module 20 comprises first circuit substrate 40 and second circuit substrate 44, as illustrated in FIG. 7. First circuit substrate 40 comprises post surface 50, post 52 protruding from post surface 50, and outer surface 54 surrounding post 52. Post 52 protrudes from post surface 50 of first circuit substrate 40. Preferably, post 52 is cylindrical in shape, having a generally circular cross-sectional shape. However, post 52 may be of any cross-sectional shape, such as square, triangular, or ovular, so long as the cross-sectional shape of post 52 conforms to the shape of opening 56.

A plurality of interconnect lands 70 overlie post surface 50 of first circuit substrate 40. Interconnect lands 70 are connected to a pattern of interconnect traces 72 also overlying post surface 50. Interconnect traces 72 electronically connect electronic components 28 to be mounted on first circuit substrate 40. Some interconnect lands 70 on first circuit substrate 40 are connected to outer surfaces 54 of posts 52. Other interconnect lands 70 on first circuit substrate 40 are connected to electronic components 28. A solder mask (not shown) is formed on post surface 50 of first circuit substrate 40. The solder mask is a discontinuous layer over post surface 50 and contains breaks around interconnect lands 70 and posts 52 of first circuit substrate 40 to permit the attachment of posts 52 to openings 56.

In one preferred embodiment of this invention, post 52 and first circuit substrate 40 are fabricated using Molded Interconnect Device substrate. The Molded Interconnect Device substrate allows for protrusions, such as post 52, to be molded into first circuit substrate 40. By using a Molded Interconnect Device substrate, first circuit substrate 40 does not need to use separate pins in order to connect to second circuit substrate 44, since posts 52 are molded to first circuit substrate 40.

Figure 6:
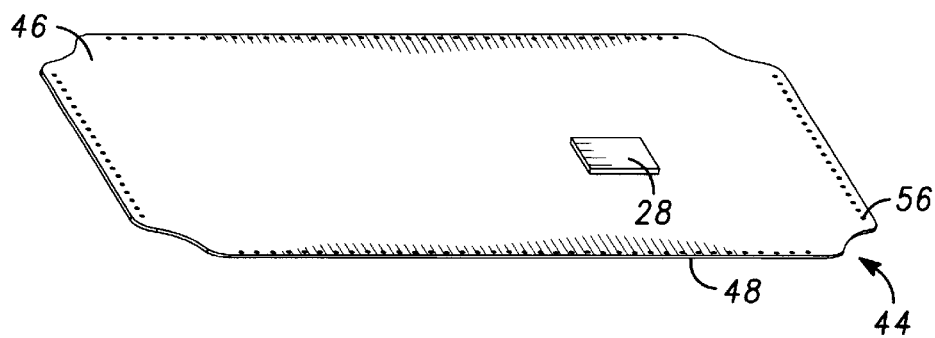
FIG. 6 is a perspective view of the second circuit substrate of the electronic module, according to one embodiment of this invention.

Second circuit substrate 44 comprises upper surface 46 and lower surface 48 opposed to upper surface 46, as illustrated in FIG. 6. Second circuit substrate 44 can be fabricated from any conventional insulating material commonly used for printed circuit boards, such as "FR4", polyamide materials, and combinations thereof. Additionally, second circuit substrate 44 can be a multi-layer printed circuit board fabricated by laminating successive layers of green sheet material. Second circuit substrate 44 forms an opening 56, as illustrated in FIG. 7. Opening 56 comprises inner surface 58 which extends from upper surface 46 to lower surface 48. Preferably, opening 56 is round in shape, however opening 56 can be any shape, such as square, triangular, or ovular, so long as the shape of opening 56 conforms with the cross-sectional shape of post 52. By using opening 56, second circuit substrate 44 does not need to use separate cables in order to connect with first circuit substrate 40, since opening 56 is designed to mate with post 52 of first circuit substrate 40.

A plurality of interconnect lands 70 overlie upper surface 46 of second circuit substrate 44. Interconnect lands 70 are connected to a pattern of interconnect traces 72 also overlying upper surface 46. Interconnect traces 72 electronically connect electronic components 28 to be mounted on second circuit substrate 44. Some interconnect lands 70 on second circuit substrate 44 are connected to inner surface 58 of opening 56. Other interconnect lands 70 on second circuit substrate 44 are connected to electronic components 28. A solder mask (not shown) is formed on upper surface 46 of second circuit substrate 44. The solder mask is a discontinuous layer over upper surface 46 and contains breaks around interconnect lands 70 and opening 56 of second circuit substrate 44 to permit the attachment of post 52 to opening 56.

In one preferred embodiment of this invention, second circuit substrate 44 is fabricated using a High Density Interconnect substrate. High Density Interconnect substrate increases the density of interconnect traces 72 on second circuit substrate 44 and thus allows for a reduction in size of second circuit substrate 44.

Outer surface 54 surrounds post 52, as illustrated in FIG. 7. Once first circuit substrate 40 and second circuit substrate 44 have been fabricated, second circuit substrate 44 is placed over first circuit substrate 40, as illustrated in FIG. 7. Opening 56 is designed to mate with post 52, such that when opening 56 is placed over post 52, outer surface 54 connects with inner surface 58. In one preferred embodiment of this invention, inner surface 58 is surrounded by a first metal and outer surface 54 is surrounded by a second metal. Preferably, the first metal and the second metal are copper, however any metal which can conduct electricity can be used for the first metal and the second metal, such as gold, silver, steel, or solder. The solder can be any metal or combination of metals having a solderable surface, such as gold, copper or any other similar metal. In addition, the solder can be a composite including an oxidizing metal having a solderable metal coating. For example, the solder can be any metal having a tin flashing or a tin/lead solder coating.

Figure 2:
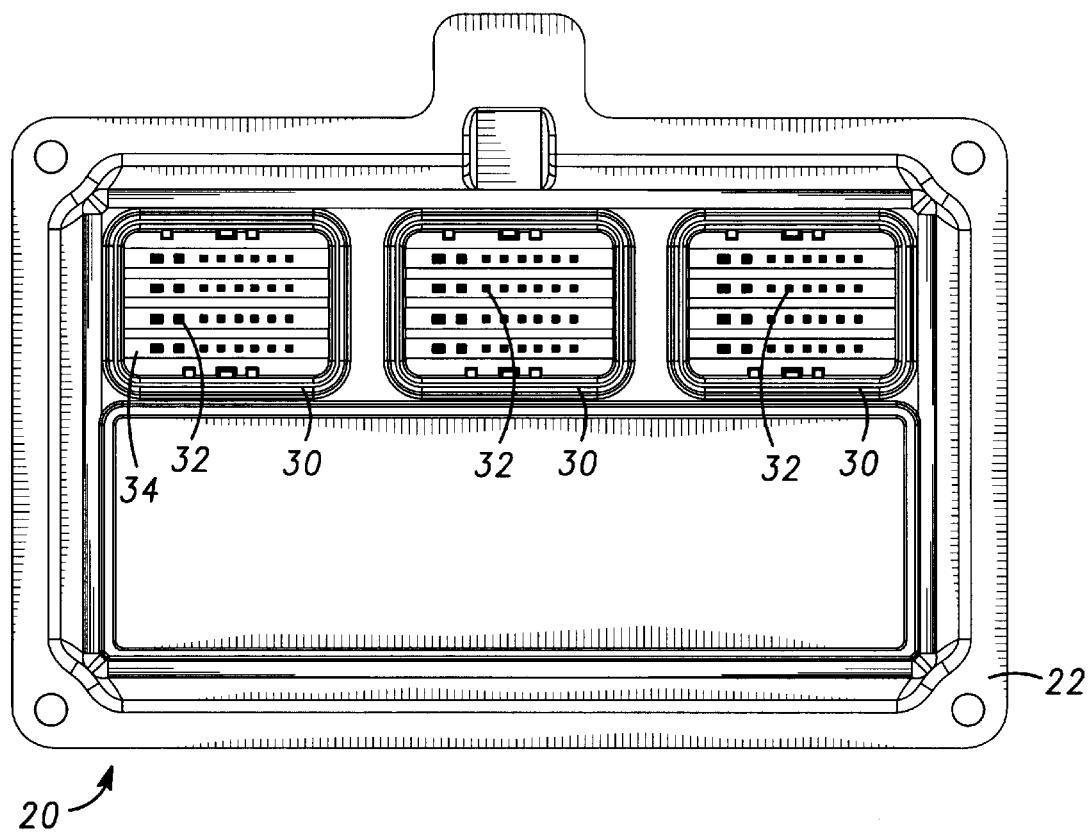
FIG. 2 is a top view of the housing of the electronic module as shown in FIG. 1, according to one embodiment of this invention.

In one preferred embodiment of this invention, first circuit substrate 40 comprises connector surface 34, as illustrated in FIG. 7. Connector surface 34 is connected to connectors 32, and is opposed to post surface 50, as illustrated in FIG. 2. Connectors 32 connect electronic module 20 to other external components, such as other electronic modules or to power supplies for powering electronic module 20. Connectors 32 are protected by connector housing 30 which is fixed with respect to bottom housing 26, as illustrated in FIG. 3.

Figure 4:
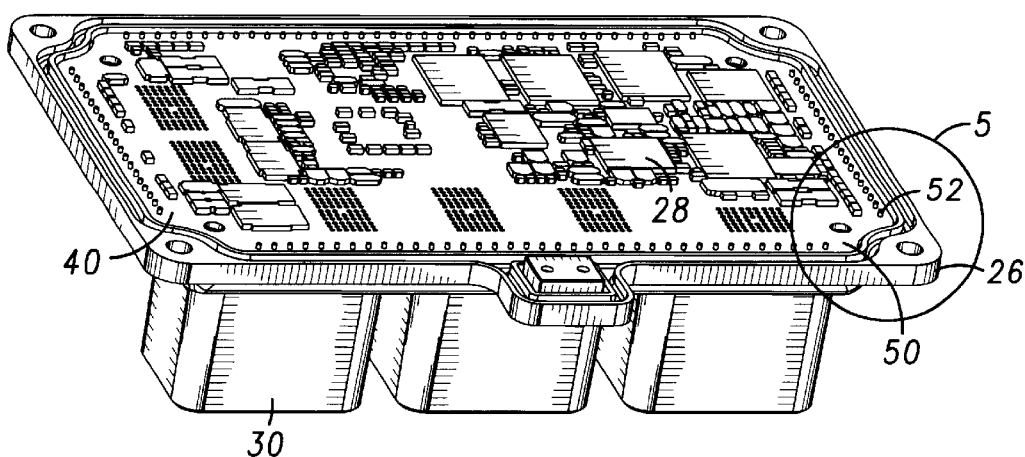
FIG. 4 is a perspective view of the first circuit substrate and the bottom housing of the electronic module, according to one embodiment of this invention.
Figure 5:
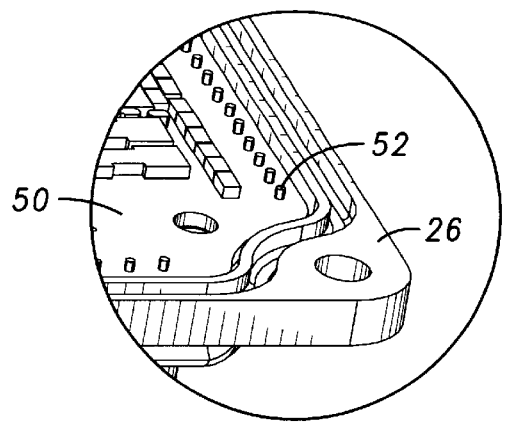
FIG. 5 is an exploded view of the first circuit substrate and the bottom housing of the electronic module as shown in FIG. 4, according to one embodiment of this invention.

In one preferred embodiment of this invention, second circuit substrate 44 forms a plurality of openings 56, as illustrated in FIG. 6, and first circuit substrate 40 has a plurality of posts 52, as illustrated in FIG. 4. Openings 56 have inner surfaces 58 extending from upper surface 46 to lower surface 48. The plurality of posts 52 protrude from post surface 50. A plurality of outer surfaces 54 surround posts 52. The plurality of openings 56 are designed to mate with the plurality of posts 52, such that when openings 56 are placed over posts 52, outer surfaces 54 make a connection with inner surfaces 58.

Figure 3:
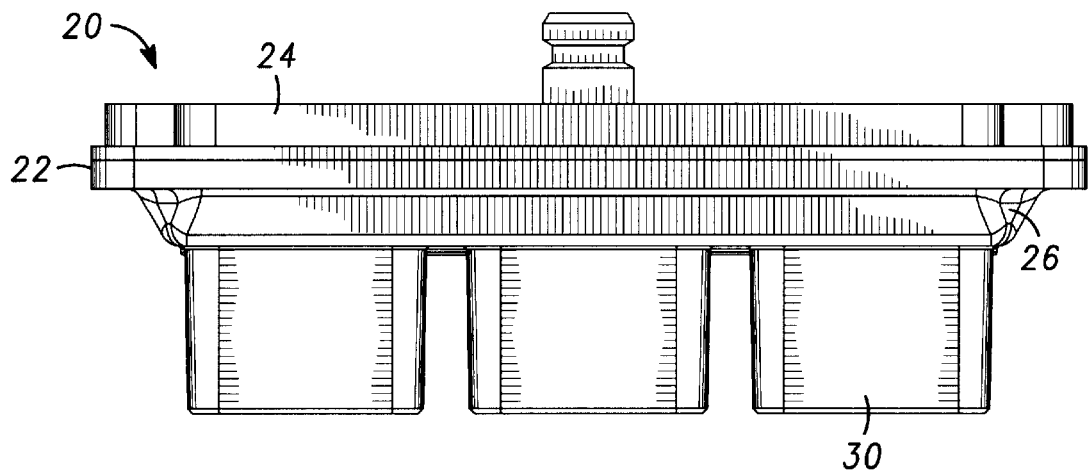
FIG. 3 is a side view of the housing of the electronic module as shown in FIG. 1, according to one embodiment of this invention.

In another preferred embodiment of this invention, electronic module 20 comprises housing 22, as illustrated in FIGS. 1–3. Housing 22 is designed to shield first circuit substrate 40 and second circuit substrate 44 from damage due to static electricity, water, or mishandling. Housing 22 comprises top housing 24 and bottom housing 26 opposed to top housing 24. Top housing 24 mates with bottom housing 26. Top housing 24 houses second circuit substrate 44 while bottom housing 26 houses first circuit substrate 40. Bottom housing 26 comprises connector housing 30. Connector housing 30 is designed to protect connectors 32.

Further advantages of the present invention can be more fully understood following a description of a representative fabrication process for the assembly of electronic module 20. The fabrication process begins by producing first circuit substrate 40 having posts 52 using Molded Interconnect Device substrate. Molded Interconnect Device substrate allows for posts 52 to be molded onto first circuit substrate 40, rather than having to insert posts 52 manually. Posts 52 protrude from post surface 50 of first circuit substrate 40. Any amount of posts 52 can be molded onto first circuit substrate 40.

Once posts 52 are in place, a first metal is plated onto outer surfaces 54 of posts 52. A plurality of interconnect lands 70 and interconnect traces 72 are formed on first circuit substrate 40 by masking a metallic foil (not shown) overlying post surface 50 and performing an etching process to remove portions of the metallic foil. The pattern which remains after the etching process constitutes the interconnect traces 72 and interconnect lands 70 on first circuit substrate 40. A solder masking process is performed on post surface 50 of first circuit substrate 40. The solder masking process applies a solder mask over post surface 50 and contains breaks around interconnect lands 70 and posts 52 of first circuit substrate 40 to permit the attachment of posts 52 to openings 56.

Next, a second circuit substrate 44 having openings 56 is produced. The second circuit substrate 44 may be produced using polyamide, FR4, or any other type of circuit substrate. In one preferred embodiment of this invention, the second circuit substrate 44 is produced by using a High Density Interconnect substrate. High Density Interconnect substrate allows for a greater amount of interconnect traces 72 to be placed onto second circuit substrate 44. Openings 56 can be formed by using an automated drilling machine, a manual drilling press, a laser, or any other means which can form a hole in a circuit substrate such as High Density Interconnect substrate. Any amount of openings 56 can be formed in second circuit substrate 44.

Once openings 56 are formed, a second metal is plated onto inner surfaces 58 of openings 56. A plurality of interconnect lands 70 and interconnect traces 72 are formed on second circuit substrate 44 by masking a metallic foil (not shown) overlying upper surface 46 and performing an etching process to remove portions of the metallic foil. The pattern which remains after the etching process constitutes the interconnect traces 72 and the interconnect lands 70 on second circuit substrate 44. A solder masking process is performed on upper surface 46 of second circuit substrate 44. The solder masking process applies a solder mask over upper surface 46 and contains breaks around interconnect lands 70 and openings 56 of second circuit substrate 44 to permit the attachment of posts 52 to openings 56. Preferably, the first metal, the second metal, and the metallic foil are copper, however any metal which can conduct electricity can be used for the first metal, the second metal, and the metallic foil, such as gold, silver, solder, or steel.

Once first circuit substrate 40 and second circuit substrate 44 have been formed, second circuit substrate 44 is placed over and connected to first circuit substrate 40 by pushing posts 52 through openings 56. In this way, outer surfaces 54 of posts 52 are connected to inner surfaces 58 of openings 56.

Next, a solder paste is applied to openings 56, inner surfaces 58, posts 52, and outer surfaces 54. Then, solder paste is also applied to interconnect lands 70 on post surface 50 and upper surface 46. Electronic components 28 are placed on the interconnect lands 70 of post surface 50 and upper surface 46. After applying solder paste, the entire assembly is subjected to a solder reflow operation, such that electronic components 28 are soldered to interconnect lands 70 simultaneously with the permanent attachment of first circuit substrate 40 to second circuit substrate 44. Thus, in a single process step electronic components 28 are attached to first circuit substrate 40 and second circuit substrate 44, and first circuit substrate 40 itself is attached to second circuit substrate 44. Electronic module 20 is then placed in housing 22 to protect first circuit substrate 40 and second circuit substrate 44.

Thus is it apparent that there has been provided, in accordance with the invention, a solder bonded electronic module that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, first circuit substrate 40 and second circuit substrate 44 may be double-sided and thus have interconnect lands 70, interconnect traces 72, and electronic components 28 on both surfaces of first circuit substrate 40 and second circuit substrate 44. Alternatively, interconnect lands 70, interconnect traces 72, electronic components 28, and posts 52 may be placed on any of the surfaces of first circuit substrate 40 and second circuit substrate 44. It is therefore intended to include within the invention all such variations and modifications as fall within the scope of the appended claims and equivalents thereof.

We claim:

1. An electronic module comprising:
    a first circuit substrate, the first circuit substrate having a post surface and a post that is molded into the first circuit substrate and that protrudes from the post surface of the first circuit substrate, wherein the post is electrically coupled to the first circuit substrate without the need for a solder connection;
    a second circuit substrate having an upper surface and a lower surface opposed to the upper surface, the second circuit substrate forming an opening, the opening having an electrically conductive inner surface extending from the upper surface to the lower surface;
    an electrically conductive outer surface surrounding the post the electrically conductive outer surface connected to the electrically conductive inner surface of the second circuit substrate; and
    wherein the electrically conductive outer surface surrounding the post provides an electrical path between the first circuit substrate and the second circuit substrate.

2. The electronic module of claim 1, wherein the first circuit substrate and the post are comprised of Molded Interconnect Device substrate.

3. The electronic module of claim 2, wherein the inner surface is surrounded by a first metal and the outer surface is surrounded by a second metal.

4. The electronic module of claim 3, wherein the first metal and the second metal comprise copper.

5. The electronic module of claim 2, wherein the second circuit substrate forms a plurality of openings, the openings have inner surfaces extending from the upper surface to the lower surface, the first circuit substrate has a plurality of posts protruding from the post surface of the first circuit substrate, a plurality of outer surfaces surround the posts, and the outer surfaces are connected to the inner surfaces of the second circuit substrate.

6. An electronic module comprising:
    a first circuit substrate comprising a Molded Interconnect Device substrate, the first circuit substrate having a post that is molded into the first circuit substrate and that protrudes from a post surface of the first circuit substrate, wherein the post is electrically coupled to the first circuit substrate without the need for a solder connection;
    a second circuit substrate made from High Density Interconnect substrate, the second circuit substrate having an upper surface and a lower surface;
    an opening in the second circuit substrate, the opening having an electrically conductive inner surface extending from the upper surface to the lower surface; and
    an electrically conductive outer surface surrounding the post, the electrically conductive outer surface in contact with and surrounded by the electrically conductive inner surface of the second circuit substrate, wherein the electrically conductive outer surface surrounding the post provides an electrical path between the first circuit substrate and the second circuit substrate.

7. The electronic module of claim 6, wherein the outer surface of the post is connected to the inner surface of the second circuit substrate.

8. The electronic module or claim 6, wherein the inner surface is surrounded by a first metal and the outer surface is surrounded by a second metal.

9. The electronic module of claim 6 further comprising a layer of solder between the inner surface and the outer surface.

10. The electronic module of claim 6 further comprising:
    a plurality of openings in the second circuit substrate, the openings having inner surfaces extending from the upper surface to the lower surface;
    a plurality of posts protruding from the first circuit substrate; and
    a plurality of outer surfaces surrounding the posts, the outer surfaces surrounded by the inner surfaces of the second circuit substrate.

11. The electronic module of claim 6 further comprising a housing surrounding the first circuit substrate and the second circuit substrate.

12. A method for producing an electronic module comprising the steps of:
- producing a first circuit substrate using Molded Interconnect Device substrate, the first circuit substrate having a post that is molded into the first circuit substrate and that protrudes from a post surface of the first circuit substrate;
- applying an electrically conductive surface to the post, wherein the post is electrically coupled to the first circuit substrate without the need for a solder connection;
- producing a second circuit substrate, the second circuit substrate having an upper surface, and a lower surface opposed to the upper surface;
- forming an opening in the second circuit substrate, the opening having an electrically conductive inner surface extending from the upper surface to the lower surface; and
- placing the post of the first circuit substrate through the opening of the second circuit substrate, wherein the electrically conductive surface on the post provides an electrical path between the first circuit substrate and the second circuit substrate.

13. The method of claim 12 further comprising the step of applying a material to the opening.

14. The method of claim 13, wherein the material comprises solder.

15. The method of claim 14 further comprising the step of subjecting the first circuit substrate and the second circuit substrate to a solder reflow operation connecting the post to the opening.

16. The method of claim 12, wherein the opening has an inner surface extending from the upper surface to the lower surface, the inner surface comprises a first metal.

17. The method of claim 16, wherein the post is surrounded by an outer surface, the outer surface comprises a second metal.

18. The method of claim 17, wherein the first metal and the second metal comprise copper.

19. The method of claim 12 further comprising the step of encasing the first circuit substrate and the second circuit substrate in a housing.

20. The method of claim 12 wherein the second circuit substrate is made from High Density Interconnect substrate.

* * * * *

UNITED STATES PATENT AND TRADEMARK OFFICE
CERTIFICATE OF CORRECTION

PATENT NO.    : 6,490,168 B1
DATED         : December 3, 2002
INVENTOR(S)   : Rochowicz et al.

It is certified that error appears in the above-identified patent and that said Letters Patent is hereby corrected as shown below:

<u>Column 6,</u>
Line 52, reads "or", should be -- of --.

Signed and Sealed this

First Day of July, 2003

JAMES E. ROGAN
*Director of the United States Patent and Trademark Office*